United States Patent [19]

Cauge et al.

[11] 3,926,694

[45] Dec. 16, 1975

[54] DOUBLE DIFFUSED METAL OXIDE SEMICONDUCTOR STRUCTURE WITH ISOLATED SOURCE AND DRAIN AND METHOD

[75] Inventors: Thomas P. Cauge, Mountain View; Joseph Kocsis, Sunnyvale, both of Calif.

[73] Assignee: Signetics Corporation, Sunnyvale, Calif.

[22] Filed: May 14, 1973

[21] Appl. No.: 359,858

Related U.S. Application Data

[62] Division of Ser. No. 274,442, July 24, 1972, abandoned.

[52] U.S. Cl. .................... 148/187; 357/23; 357/41

[51] Int. Cl.² .................... H01L 21/22

[58] Field of Search ...... 148/187; 317/235 B, 235 G

[56] References Cited

UNITED STATES PATENTS

| | | | |
|---|---|---|---|
| 3,479,237 | 11/1969 | Bergh et al. | 148/187 |
| 3,600,642 | 8/1971 | Allison et al. | 148/186 X |
| 3,690,966 | 9/1972 | Hayashi et al. | 148/187 |

OTHER PUBLICATIONS

Rodari, Def. Pub., T887,081.

*Primary Examiner*—L. Dewayne Rutledge
*Assistant Examiner*—J. M. Davis
*Attorney, Agent, or Firm*—Flehr, Hohbach, Test, Albritton & Herbert

[57] ABSTRACT

Metal oxide semiconductor structure having precisely grown channel with the source and drain isolated from each other by a PN junction.

In the method, a double diffusion is carried out through the same opening in an oxide or insulating layer to obtain a very narrow precise channel region with minimum spreading and which can be utilized with a P-type substrate to provide PN isolation between the source and drain.

8 Claims, 6 Drawing Figures

DOUBLE DIFFUSED METAL OXIDE SEMICONDUCTOR STRUCTURE WITH ISOLATED SOURCE AND DRAIN AND METHOD

This is a division, of application Ser. No. 274,442 filed July 24, 1972, now abandoned.

BACKGROUND OF THE INVENTION

1. Field of the Invention

This invention relates to metal oxide semiconductor structures and more particularly to such structures utilizing double diffusion with isolated source and drain.

2. Description of the Prior Art

In copending application Ser. No. 854,370, filed Sept. 2, 1969 which was abandoned in favor of continuing application Ser. No. 183,291, now abandoned, there is disclosed a high voltage frequency metal oxide semiconductor device and method utilizing double diffusion. However the construction therein disclosed is not particulary adaptable to integrated circuits because the drain was common to the N-type substrate in which the metal oxide semiconductor (hereinafter referred to as MOS) structure was fabricated. In conventional MOS devices, the source and drain are isolated from each other and are isolated from the substrate. However such is not the case when a double diffusion is used for defining the channel. There is therefore a need for an MOS structure and method which would make it possible to provide MOS devices in an integrated circuit that would be isolated from each other and would still make it possible to utilize the very desirable characteristics of a double diffusion to define the channel.

SUMMARY OF INVENTION AND OBJECTS

The metal oxide semiconductor structure consists of a semiconductor body of one conductivity type with a layer of semiconductor material carried by the semiconductor body having an opposite conductivity type. The layer is provided with a substantially planar surface. A layer of insulating material is formed on the planar surface. A first diffused channel region of said one conductivity type is formed in said layer and is surrounded by a second PN junction which extends from said surface through said layer to said semiconductor body. A second source region is formed in said channel region in said layer of opposite conductivity type and is bounded by a second PN junction which is substantially dish-shaped and extends to the surface. The first and second PN junctions define a channel of precise length. A third diffused region of opposite conductivity type is formed in said layer outside of said channel region and is bounded by a third PN junction which is substantially dish-shaped and extends to the surface. Metallization is provided forming gate, source and drain contacts, with the metallization overlying said layer of insulating material, and making contact through the insulating layer with the second diffused region to provide a source contact and through said third diffused region to provide a drain contact. The metallization also overlies the channel and is separated from the channel by said layer of insulating material to form the gate contact. The source and drain regions are isolated from each other by the first PN junction and by the PN junction between the layer of semiconductor material and the semiconductor body.

In general, it is an object of the present invention to provide a metal oxide semiconductor oxide structure and method in which a double diffusion is utilized and the source and drain are isolated from each other.

Another object of the invention is to provide a structure and method of the above character which is particularly adapted for use in integrated circuits.

Additional objects and features of the invention will appear from the following description in which the preferred embodiment is set forth in detail in conjunction with the accompanying drawing.

DESCRIPTION OF THE PREFERRED EMBODIMENT

Figure 1:
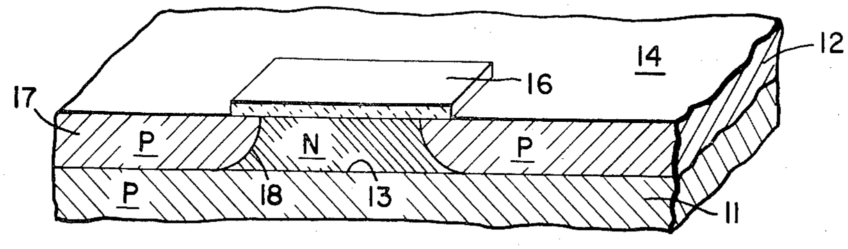
FIGS. 1 to 6 are partial isometric views partially in cross section showing the method utilized for constructing a metal oxide semiconductor structure incorporating the present invention.

The starting material for making the metal oxide semiconductor structure incorporating the present invention consists of a semiconductor body 11 formed of a suitable material such as silicon which has an impurity of one conductivity type namely a P-type conductivity therein. The semiconductor body or substrate 11 generally has a fairly high resistivity typically between 8 to 16 ohm centimeter. A thin layer 12 formed of a suitable semiconductor material such as silicon is carried by the body 11. The layer 12 can be deposited in an epitaxial reactor and typically has a resistivity of approximately 6 ohm centimeter and may have a thickness ranging from 1 to 3 microns. A first PN junction 13 is formed between the substrate or body 11 and the layer 12. The layer 12 is provided with a planar surface 14 through which diffusions are carried out as hereinafter described.

A layer 16 of a suitable insulating material such as silicon dioxide is provided on the surface 14 and is adherent thereto. The layer 16 can be formed in a suitable manner such as by thermally growing or depositing it so that it is relatively thick as for example 8,000 Angstroms.

A first mask (not shown) is provided for defining an area in which the oxide will serve as a mask for subsequent channel and isolation diffusions. This oxide mask is formed by utilizing conventional photolithographic techniques in connection with the first mask and then etching away the undesired oxide so that there is a remainder of the oxide layer 16 as shown in FIG. 1 which will serve as a mask. The oxide mask 16 can have any desired geometry as for example rectangular as shown in the drawing.

After the oxide mask has been formed as shown in FIG. 1, the structure shown in FIG. 1 has an impurity of the one conductivity type, namely the P-type, diffused through the exposed areas of the surface 14 to form a first channel region 17 which extends all the way from the surface 14 down to the semiconductor body 11. This channel region 17 is defined by a second PN junction 18 which extends from the surface 14 down into the semiconductor body 11. As is well known to those skilled in the art, during the time that the impurity is diffusing downwardly, it will diffuse laterally or sideways in a ratio in which the diffusion sideways is approximately two-thirds of the depth of the diffusion. Thus it can be seen by determining the depth of the diffusion, it is relatively easy to calculate rather precisely the lateral diffusion. Because of the lateral diffusion, the PN junction is curved upwardly and outwardly and extends to the surface below the oxide mask 16 as shown in FIG. 1.

Figure 2:
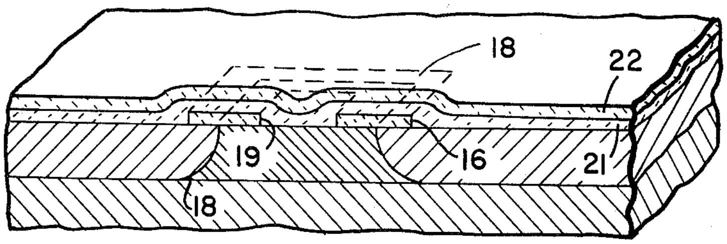

Thereafter as shown in FIG. 2, a second mask (not shown) which is utilized for making the drain contact is used in connection with conventional photolithographic and etching techniques to form a rectangular opening 19 in the remaining oxide mask 16. An oxide-nitride sandwich is then formed over the layer 14, over the oxide mask 16 and into the opening or window 19 in the oxide mask. The oxide nitride sandwich is formed in a suitable manner such as by a sequential deposition process. Both can be deposited in a pyrolytic reaction. For example, the silicon nitride can be deposited in a conventional silane ammonia reaction at approximately 1,000°C to a thickness of approximately 1,000 Angstroms. Thereafter, the silicon oxide can be deposited to a thickness of approximately 2,000 Angstroms so that the combined thickness of the oxide nitride sandwich is approximately 3,000 Angstroms. As can be seen from FIG. 2 and as will be noted hereinafter, the silicon nitride completely covers what is going to be the active part of the semiconductor structure.

Figure 3:
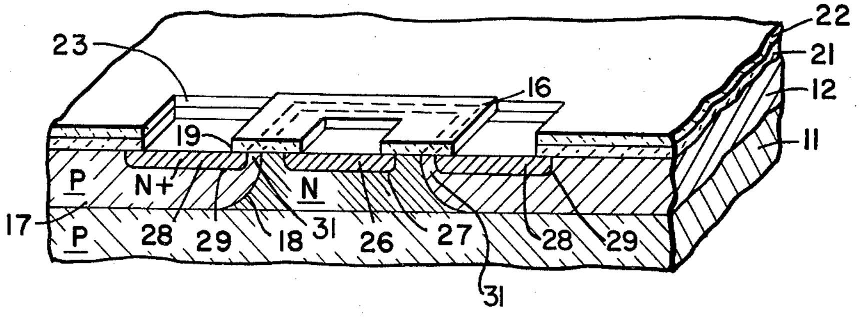
Figure 4:
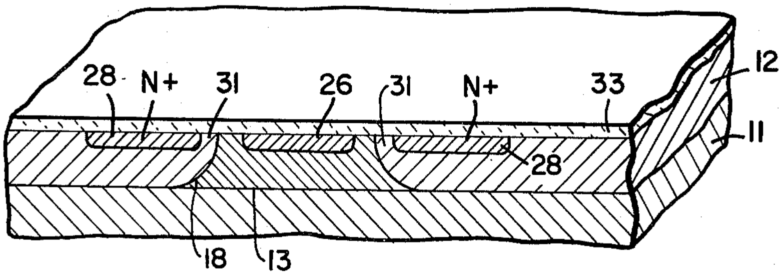

A third mask (not shown) is then provided which is utilized in conjunction with conventional photolithographic and etching techniques to form openings 23 in the silicon dioxide layer 22 as shown in FIG. 3. Thereafter the exposed silicon nitride layer 21 is also removed with a conventional etch. The oxide layer 22 serves as mask for protecting the silicon nitride layer 21 and therefore permits the openings 23 to be formed all the way down to the surface 14 of the layer 12 and through the opening 19. It can be seen in this manner that the original outline of the oxide mask 16 is still preserved by the utilization of the oxide-nitride sandwich. It can be appreciated that other materials other than the silicon nitride and the silicon dioxide can be utilized. However it is desirable that two materials be utilized in which one layer is attacked selectively by one etch and the other layer is attacked selectively by another etch.

An N-type impurity is then diffused through the openings 23 and 19 to provide the N+ drain region 26 in the N-type material of the layer 12. The region 26 is defined by a dish-shaped junction 27 extending to the surface 14 below the oxide 16. Simultaneously N+ source regions 28 are formed below the window or opening 23 within the channel region 17 and are defined by dish-shaped PN junctions 29 which extends to the surface 14 below the oxide layer 16 and below the silicon nitride layer 21. PN junctions 18 and 29 define channels 31 having a precise length underlying the oxide layer 16. It can be seen that the outer margin of the oxide layer 16 served as the mask for forming the PN junction 18 and also for forming the PN junction 29. Since this outer margin of the oxide layer 16 is unchanged, it is relatively easy to precisely control the lateral dimension of the channels 31 on the surface 14 by controlling the two diffusions which form the regions 17 and 28. Typical channel lengths which can be fabricated in accordance with the present process range from 0.3 microns up to 2.5 microns.

Alternatively the N+ regions 26 and 28 can be formed by depositing a low temperature glass carrying a suitable N type impurity such as phosphorous in the opening 19 and over the mask 16 and the exposed surface 14 after the opening 19 has been formed and before any oxide-nitride sandwich has been deposited. A negative of the mask used in FIG. 3 is used for exposing photoresist on the low temperature glass and the undesired low temperature glass is etched away so that there remains low temperature glass in the opening 19 and on the areas of the surface 14 overlying the areas through which the regions 28 are to be formed. The structure is then heated and the low temperature glass acts as a solid diffusion source to form the regions 26 and 28 of the same configuration as shown in FIG. 3. The same edges of the mask 16 are used for the diffusion steps for forming the channels 31 as in the preceding process. The low temperature glass is then etched away and thereafter the mask 16 is removed to provide a surface 14 which is free.

With the oxide-nitride sandwich process, after the N+ diffusion has been carried out as shown in FIG. 3, the silicon dioxide layers 16 and 22 are removed by utilization of a suitable etch and then removing the remaining nitride layer 21 with a conventional nitride etch so that the silicon surface is free or clear.

After the surface 14 is free with either the oxide nitride sandwich process or with the low temperature glass process, a relatively thick layer 33 of a suitable insulating material such as silicon dioxide is formed on the surface 14. This layer can be grown thermally or it can be deposited at a low temperature. Typically, the layer 33 can have a thickness varying from 8,000 Angsroms to a micron.

A fourth mask (not shown) is then utilized in conjunction with the conventional photolithographic and etching techniques to open windows or openings 34 in the thick oxide layer 13 to expose the surface 14 overlying the gate region for the semiconductor structure. Thereafter a thin layer 33*a* of a suitable insulating material such as silicon dioxide is either thermally grown or deposited on the surface 14 in the windows 34 to a typical depth of approximately 1,000 Angstroms to form a gate oxide. Typically the width of the gate region would be approximately 8 to 10 microns which would overlie the channel region typically 1 to 2 microns in width.

Figure 5:
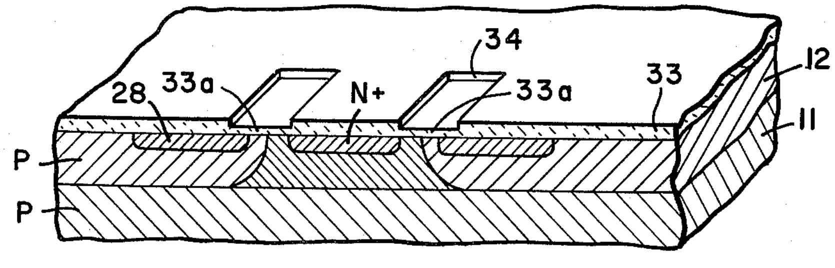
Figure 6:
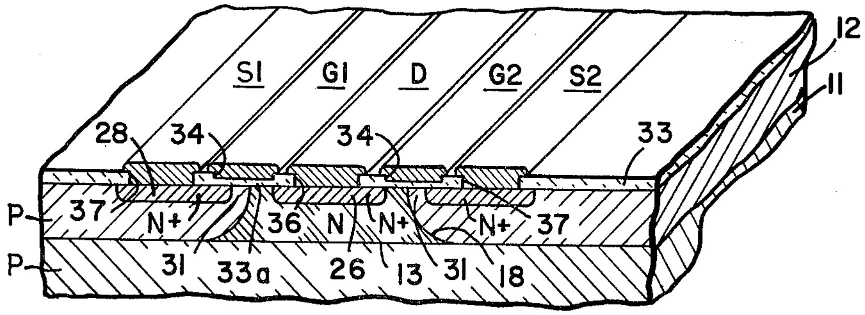

After the gate oxide has been formed as shown in FIG. 5, a fifth mask (not shown) is utilized in conjunction with conventional photolithographic and etching techniques to provide a drain contact opening 36 and source contact openings 37 in the thick oxide layer 33 to expose the surface 14 overlying the appropriate regions (see FIG. 6). As can be seen, the contact openings 36 and 37 are substantially rectangular as is the opening 34 for the gate. A suitable metal such as aluminum is then evaporated over the entire surface of silicon dioxide layer 33 and into the openings 34, 36 and 37. Thereafter, by the use of a sixth mask (not shown) and conventional photolithographic and etching techniques, the undesired metal is removed so that there remains source contact stripes identified as S1 and S2 making contact with the source regions 28 through the windows 37, gate stripes G1 and G2 overlying the thin gate oxide layer 33*a* and the channel 31 and a drain stripe D making contact to the drain region by contacting the N+ region 26.

From the semiconductor structure shown in FIG. 6 it can be seen that there has been provided an MOS structure in which the source and drain have been isolated from each other by a PN junction isolation consisting of the junction 18 in combination with the junction 13. This PN junction also serves to isolate the source and drain from the P type substrate 11. This construction makes possible the incorporation of such MOS devices in integrated circuits and the like while at the same time retaining all of the advantages of a double diffusion by utilizing the outer edge of the oxide mask for both diffusion steps. The method utilized is compatible with existing processing techniques.

We claim:

1. In a method for forming a metal insulator semiconductor structure, providing a semiconductor body having at least a portion thereof with an impurity of one conductivity type, forming a layer of semiconductor material of opposite conductivity type on said body to form a first PN junction between said body and said layer of semiconductor material, said layer having a substantially planar surface, forming a mask on said surface of the semiconductor layer having an edge overlying said surface, diffusing with an impurity of said one conductivity type through said surface utilizing said mask to provide a first region of said one conductivity type having a depth which extends from said surface through said layer of semiconductor material to said semiconductor body and being defined by a PN junction which extends from the surface beneath the mask through the layer to the semiconductor body, diffusing with heat an impurity of opposite conductivity type through said surface using the same edge of the mask to form a second region in said first region which is offset in said first region and with a surface area substantially less than the surface area of said first region and which is defined by a second PN junction which extends to the surface below the mask, said second region having a depth substantially less than the depth of said first region, said last named diffusion of said impurity of opposite conductivity type causing movement of said second PN junction so that the line along which it extends to the surface is beneath said mask, controlling the diffusion of said first and second regions whereby said first and second PN junctions define a channel underlying the mask having a precisely controlled length, providing a layer of insulating material on the surface, and providing metalization on said layer of insulating material for forming gate, source and drain contacts.

2. A method as in claim 1 together with the step of forming an opening in said mask prior to the diffusion of said second region to form a window for the drain contact, depositing a sandwich of two layers of two different materials over said mask and in the opening in said mask, forming an opening in said sandwich sufficiently large enough to uncover the mask and the opening in the mask by selectively removing one of the materials in a predetermined area and thereafter selectively removing the other of the two materials in a predetermined area.

3. A method as in claim 2 wherein one of the two materials of the sandwich is silicon dioxide wherein said mask is formed of silicon dioxide.

4. A method as in claim 3 wherein the other of the two materials is silicon nitride.

5. A method as in claim 2 wherein said sandwich is removed after the diffusion of the source region is completed.

6. A method as in claim 1 together with the step of forming an opening in said mask prior to the diffusion of the second region, depositing a low temperature glass having an impurity of opposite conductivity type in the opening, on the mask and the areas adjacent the mask, removing undesired portions of the glass, and diffusing impurities from the glass into the layer of semiconductor material to form the second region.

7. In a method for forming a semiconductor structure having one and opposite conductivity type regions formed in a one conductivity body having a surface and a channel having a precise length between said regions and said body at said surface, the method comprising, providing a semiconductor body of one conductivity type having a substantially planar surface, forming a masking layer on said surface, removing a portion of said masking layer from said surface to provide a mask edge on said surface, diffusing a first region of opposite conductivity type extending downwardly from said surface into said body using said edge of said mask to define said first region, diffusing with heat an impurity of one conductivity type extending downwardly from said surface into said body within said first region to a depth substantially less than the depth of the first region using the same edge of said mask, said last named diffusion of said impurity of one conductivity type causing movement of said first named region beneath said mask, controlling the diffusion of the first and second regions to form a channel region at said surface having a precise length.

8. A method as in claim 7 together with the additional steps prior to forming said second region at said mask edge of forming an opening in said mask spaced from said mask edge and exposing a portion of said body, forming a sandwich of two layers of two different materials over said mask and said exposed surface, forming an opening is said sandwich exposing a portion of said body adjacent said defined mask edge and in registry with the remaining mask edges by selectively removing one of the materials in a predetermined area and thereafter selectively removing the other of the two materials in a predetermined area, and utilizing said mask for forming the second region so that it is precisely spaced from the first region.

* * * * *